US012599006B2

(12) United States Patent (10) Patent No.: US 12,599,006 B2
Ishimatsu et al. (45) Date of Patent: Apr. 7, 2026

(54) ELECTRONIC DEVICE

(71) Applicant: ROHM CO., LTD., Kyoto (JP)

(72) Inventors: Yuji Ishimatsu, Kyoto (JP); Kenji Hama, Kyoto (JP); Hideo Hara, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 686 days.

(21) Appl. No.: 17/914,088

(22) PCT Filed: Mar. 22, 2021

(86) PCT No.: PCT/JP2021/011701
§ 371 (c)(1),
(2) Date: Sep. 23, 2022

(87) PCT Pub. No.: WO2021/200336
PCT Pub. Date: Oct. 7, 2021

(65) Prior Publication Data
US 2023/0121777 A1 Apr. 20, 2023

(30) Foreign Application Priority Data

Apr. 1, 2020 (JP) ................................ 2020-065762

(51) Int. Cl.
H01L 25/16 (2023.01)
H01L 23/00 (2006.01)
H01L 23/495 (2006.01)

(52) U.S. Cl.
CPC .. H01L 23/49562 (2013.01); H01L 23/49537 (2013.01); H01L 23/49575 (2013.01);
(Continued)

(58) Field of Classification Search
CPC ......... H01L 23/49562; H01L 23/49537; H01L 23/49575; H01L 24/48; H01L 24/32;
(Continued)

(56) References Cited

U.S. PATENT DOCUMENTS 5,523,621 A * 6/1996 Kikuchi ............ H01L 23/49822
257/784
6,585,905 B1 * 7/2003 Fan ..................... H01L 21/4832
257/E23.046
(Continued)

FOREIGN PATENT DOCUMENTS

JP 2017-112153 A 6/2017
JP 2019-186321 A 10/2019
(Continued)

OTHER PUBLICATIONS

Office Action issued in corresponding German Patent Application No. 11 2021 000 700.9, Mar. 10, 2023, 12 pages w/translation.
(Continued)

*Primary Examiner* — Dale E Page
*Assistant Examiner* — Cristian A Tivarus
(74) *Attorney, Agent, or Firm* — HSML P.C.

(57) ABSTRACT

An electronic device includes: a substrate with obverse and reverse surfaces spaced apart in a thickness direction; an electronic element having an obverse surface formed with a first obverse surface electrode; a wiring portion on the substrate obverse surface and configured to transmit a control signal for the electronic element; a conduction member with obverse and reverse surfaces spaced apart in the thickness direction, where the reverse surface is joined to the wiring portion; a conductive first lead on the substrate obverse surface; and a first connecting member joined to the obverse surface of the conduction member and the first obverse surface electrode. The first lead includes a first pad portion spaced apart from the wiring portion and to which the electronic element is joined. The wiring portion and the first obverse surface electrode are electrically connected to each other via the conduction member and the first connecting member.

19 Claims, 11 Drawing Sheets

(52) U.S. Cl.
CPC .............. *H01L 24/48* (2013.01); *H01L 24/32*
(2013.01); *H01L 2224/32245* (2013.01); *H01L*
*2224/48247* (2013.01)

(58) Field of Classification Search
CPC . H01L 2224/32245; H01L 2224/48247; H01L
23/49568; H01L 23/49541; H01L
23/49531; H01L 25/16
See application file for complete search history.

(56) References Cited

U.S. PATENT DOCUMENTS

| | | | | |
|---|---|---|---|---|
| 9,099,331 | B2 * | 8/2015 | Okumura ................ | H01L 25/04 |
| 9,716,054 | B2 * | 7/2017 | Koga ..................... | H01L 24/37 |
| 2008/0157310 | A1 | 7/2008 | Lee et al. | |
| 2009/0129038 | A1 * | 5/2009 | Takakusaki ............. | H01L 25/16 |
| | | | | 361/772 |
| 2017/0033035 | A1 * | 2/2017 | Sato .................... | H01L 25/0753 |
| 2019/0051640 | A1 * | 2/2019 | Yano .................... | H10D 89/911 |
| 2019/0067212 | A1 * | 2/2019 | Cadag .................... | H01L 21/78 |
| 2019/0331729 | A1 * | 10/2019 | Degrenne .......... | G01R 31/2818 |

FOREIGN PATENT DOCUMENTS

| | | |
|---|---|---|
| JP | 2020-4893 A | 1/2020 |
| WO | 2016/125363 | 8/2016 |

OTHER PUBLICATIONS

International Search Report issued in PCT/JP2021/011701, Jun. 1, 2021 (2 pages).
Office Action issued in corresponding Japanese Patent application No. 2022-511955, Oct. 1, 2024, and machine translation.

* cited by examiner

FIG.1

ELECTRONIC DEVICE

TECHNICAL FIELD

The present disclosure relates to an electronic device.

BACKGROUND ART

An electronic device called IPM (Intelligent Power Module) is one of various electronic devices. The electronic device includes an electronic element, a control element, and a lead frame (see Patent Document 1). The electronic element is a power semiconductor element that controls power. The control element controls the electronic element. The lead frame supports the electronic element and the control element and provides a conduction path for these elements.

PRIOR ART DOCUMENTS

Patent Document

Patent Document 1: JP-A-2020-4893

SUMMARY OF THE INVENTION

Problem to be Solved by the Invention

Commonly, as the number of control signals that are input to or output from the control element increases, the number of conduction paths to the control element needs to be increased. However, as the integration density of the electronic device increases, it becomes difficult to form conduction paths using metal lead frames in a small space, as in conventional cases. Actually, the lead frames are formed and processed through pressing performed using a mold or etching, and therefore, it is difficult to make the conduction paths thin or increase the density of the conduction paths.

In view of the foregoing, the present disclosure has an object of providing an electronic device that enables a further increase in the integration density.

Means for Solving the Problem

An electronic device provided according to an aspect of the present disclosure includes: a substrate that includes a substrate obverse surface and a substrate reverse surface that are spaced apart from each other in a thickness direction; an electronic element that includes an element obverse surface on which a first obverse surface electrode is formed; a wiring portion that is formed on the substrate obverse surface and transmits a control signal for controlling the electronic element; a conduction member that includes an obverse surface and a reverse surface that are spaced apart from each other in the thickness direction, where the reverse surface is joined to the wiring portion; a conductive first lead that is arranged on the substrate obverse surface; and a first connecting member that is joined to the obverse surface of the conduction member and the first obverse surface electrode. The first lead includes a first pad portion that is spaced apart from the wiring portion and to which the electronic element is joined. The wiring portion and the first obverse surface electrode are electrically connected to each other via the conduction member and the first connecting member.

Advantages of the Invention

According to the electronic device of the present disclosure, the integration density can be increased when compared with conventional electronic devices.

BRIEF DESCRIPTION OF DRAWINGS

FIG. 1 is a perspective view showing an electronic device according to a first embodiment.

MODE FOR CARRYING OUT THE INVENTION

Figure 2:
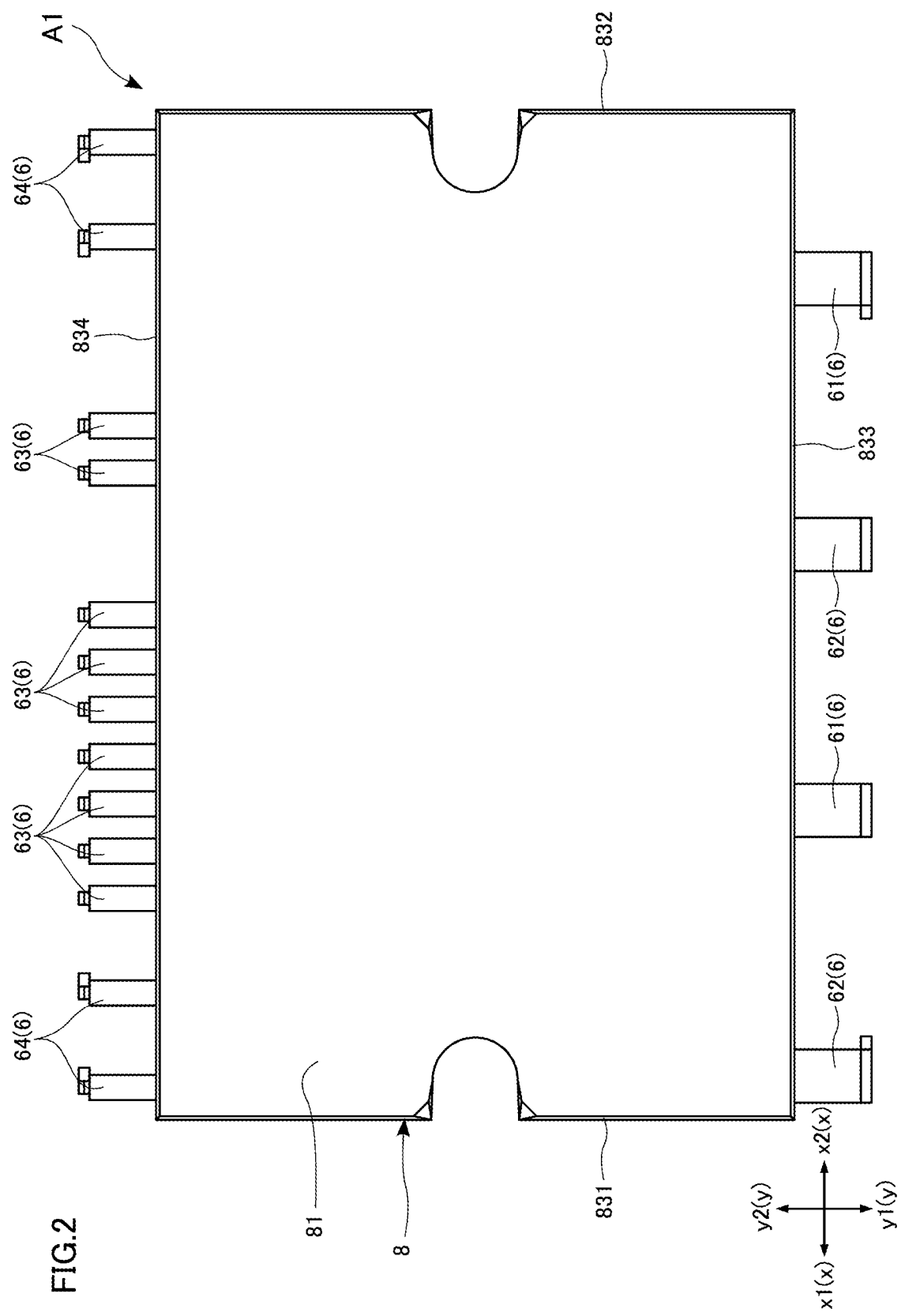
FIG. 2 is a plan view showing the electronic device according to the first embodiment.

Preferred embodiments of an electronic device according to the present disclosure will be described below with reference to the drawings.

Figure 1:
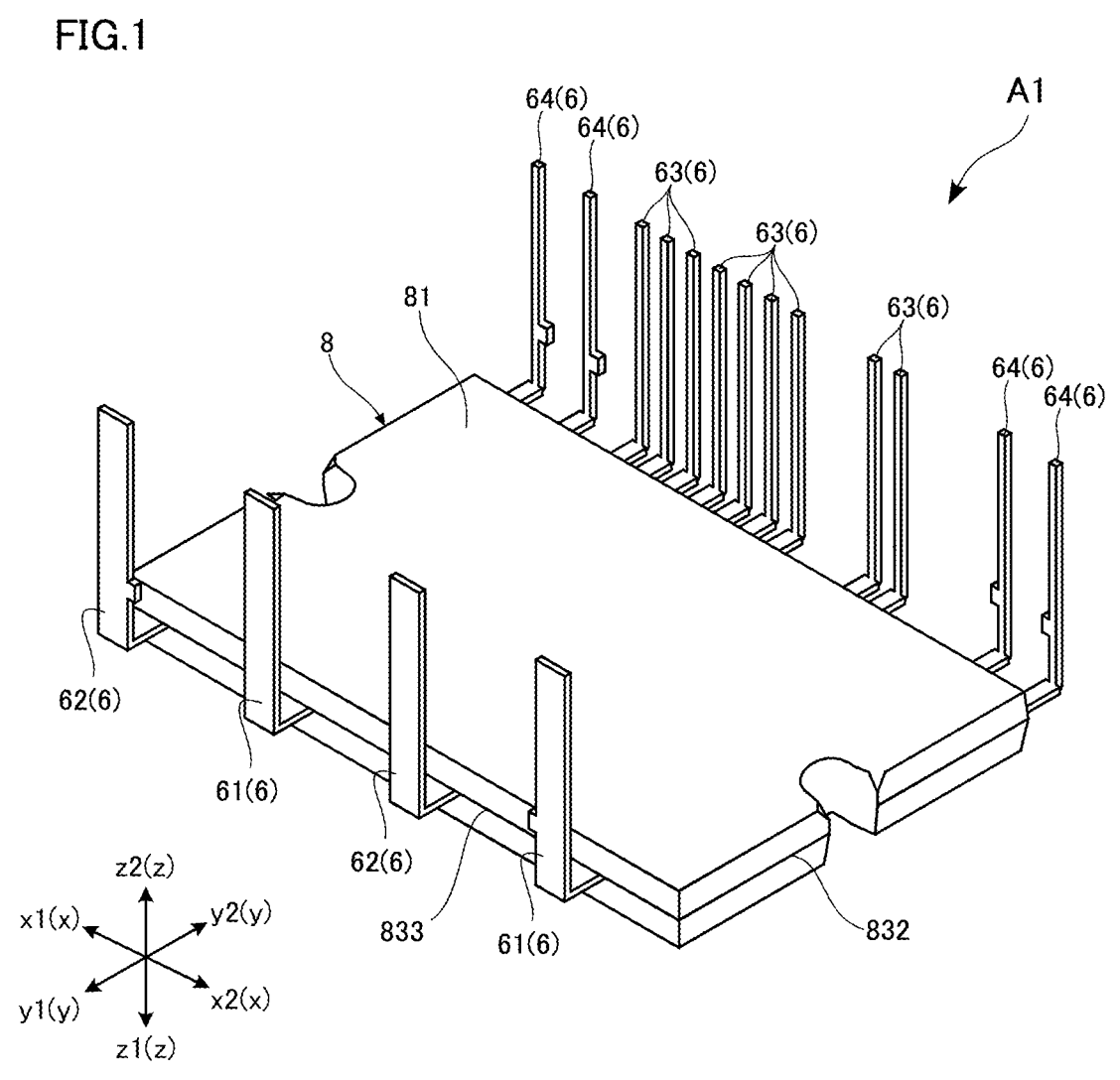

FIGS. 1 to 9 show an electronic device A1 according to a first embodiment. The electronic device A1 includes a substrate 1, wiring portions 2, two electronic elements 3, two control elements 4, a plurality of passive elements 5, a plurality of leads 6, a plurality of first connecting members 71, a plurality of second connecting members 72, a plurality of third connecting members 73, and a resin member 8. The plurality of leads 6 include a plurality of first leads 61, a plurality of second leads 62, a plurality of third leads 63, and a plurality of fourth leads 64. The electronic device A1 is, for example, an IPM (Intelligent Power Module), but the present disclosure is not limited to this example. The electronic device A1 is used in an air conditioner, a motor control device, or the like.

Figure 3:
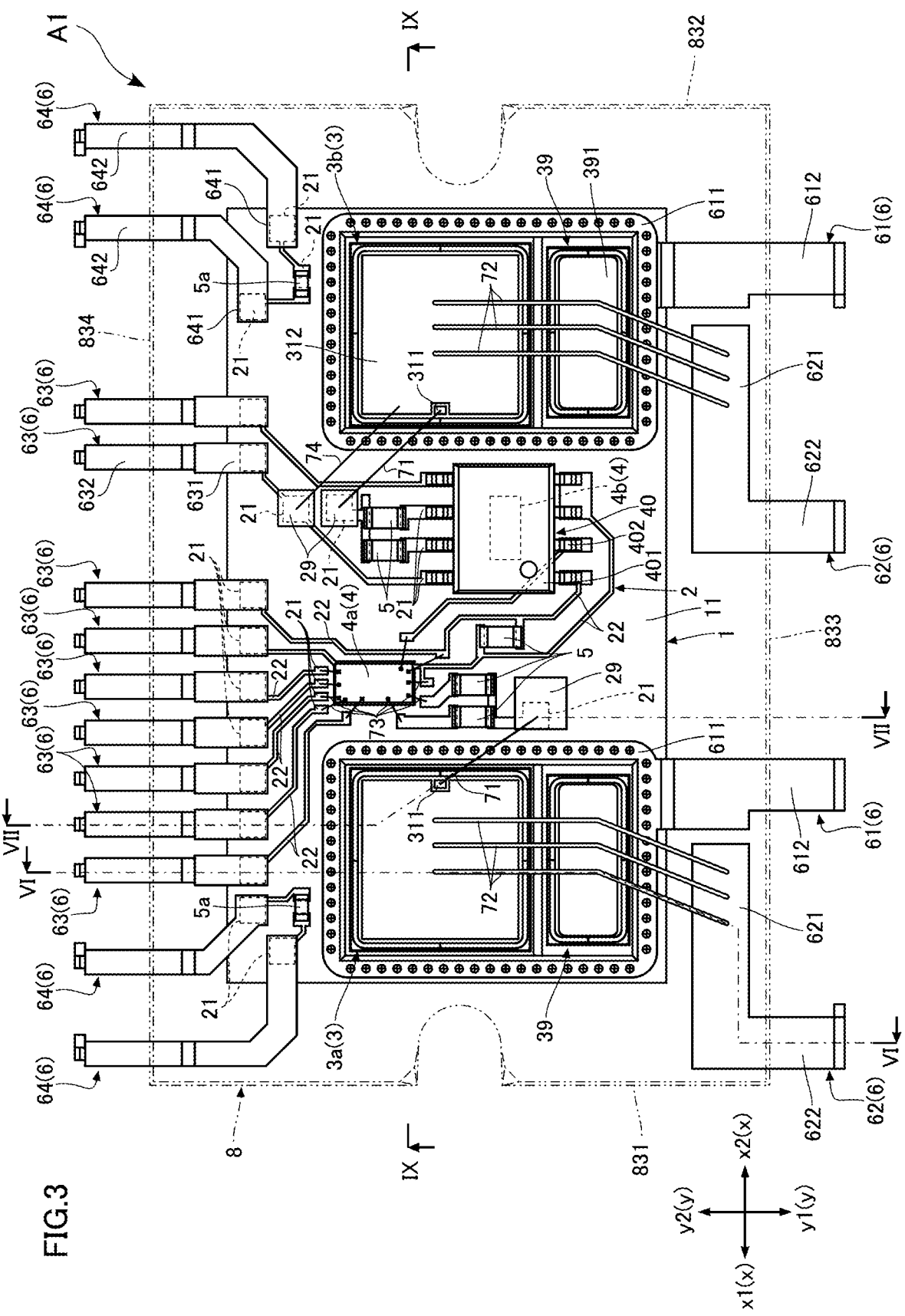
FIG. 3 is a plan view showing the electronic device according to the first embodiment, in which a resin member is shown using an imaginary line.
Figure 4:
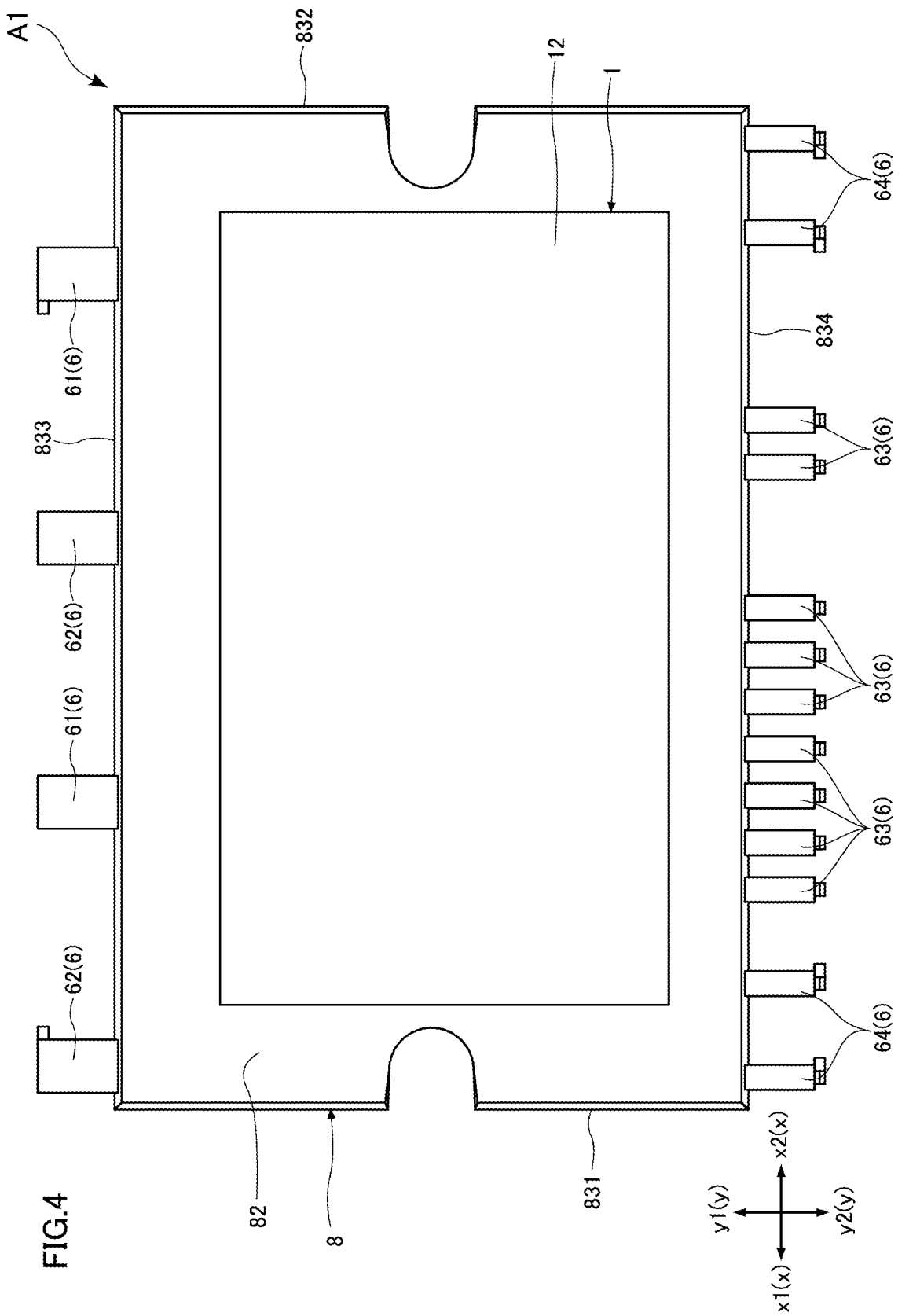
FIG. 4 is a bottom view showing the electronic device according to the first embodiment.
Figure 5:
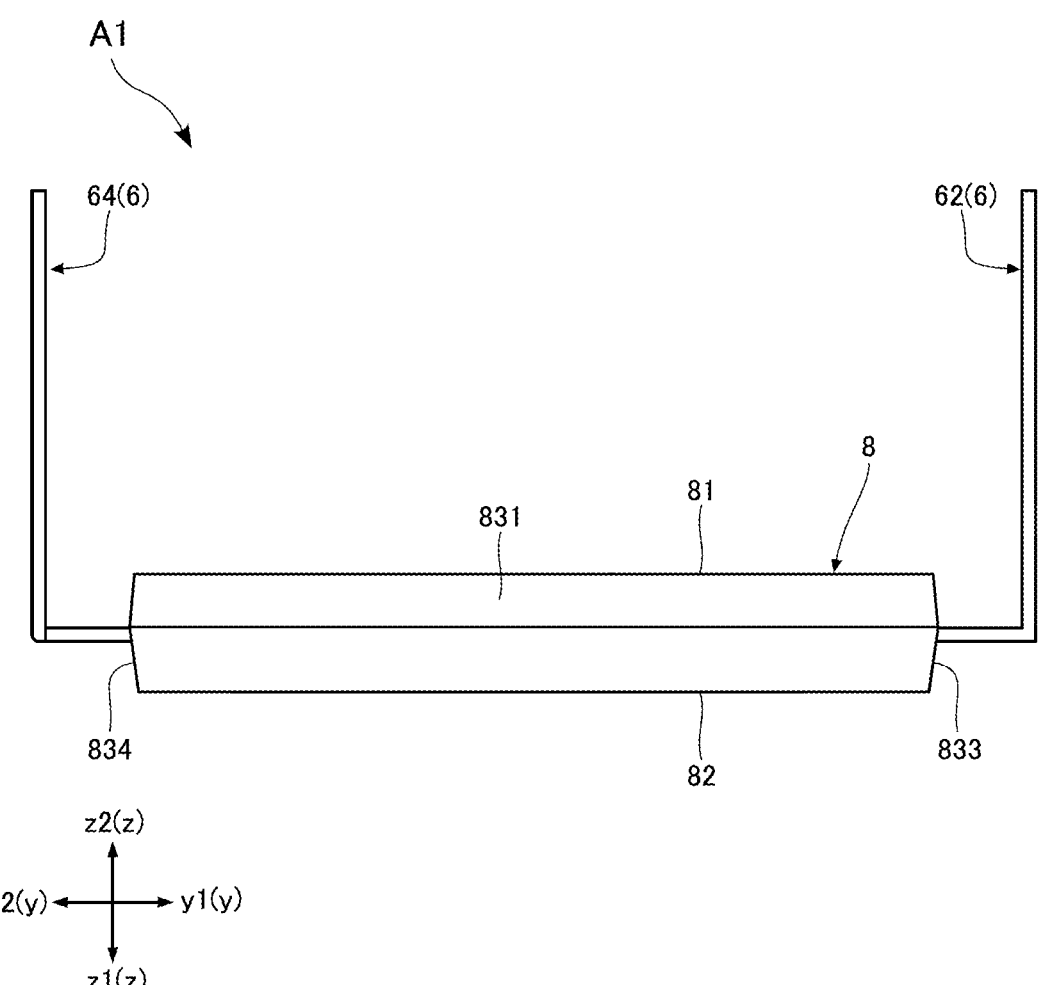
FIG. 5 is a side view (left side view) showing the electronic device according to the first embodiment.
Figure 6:
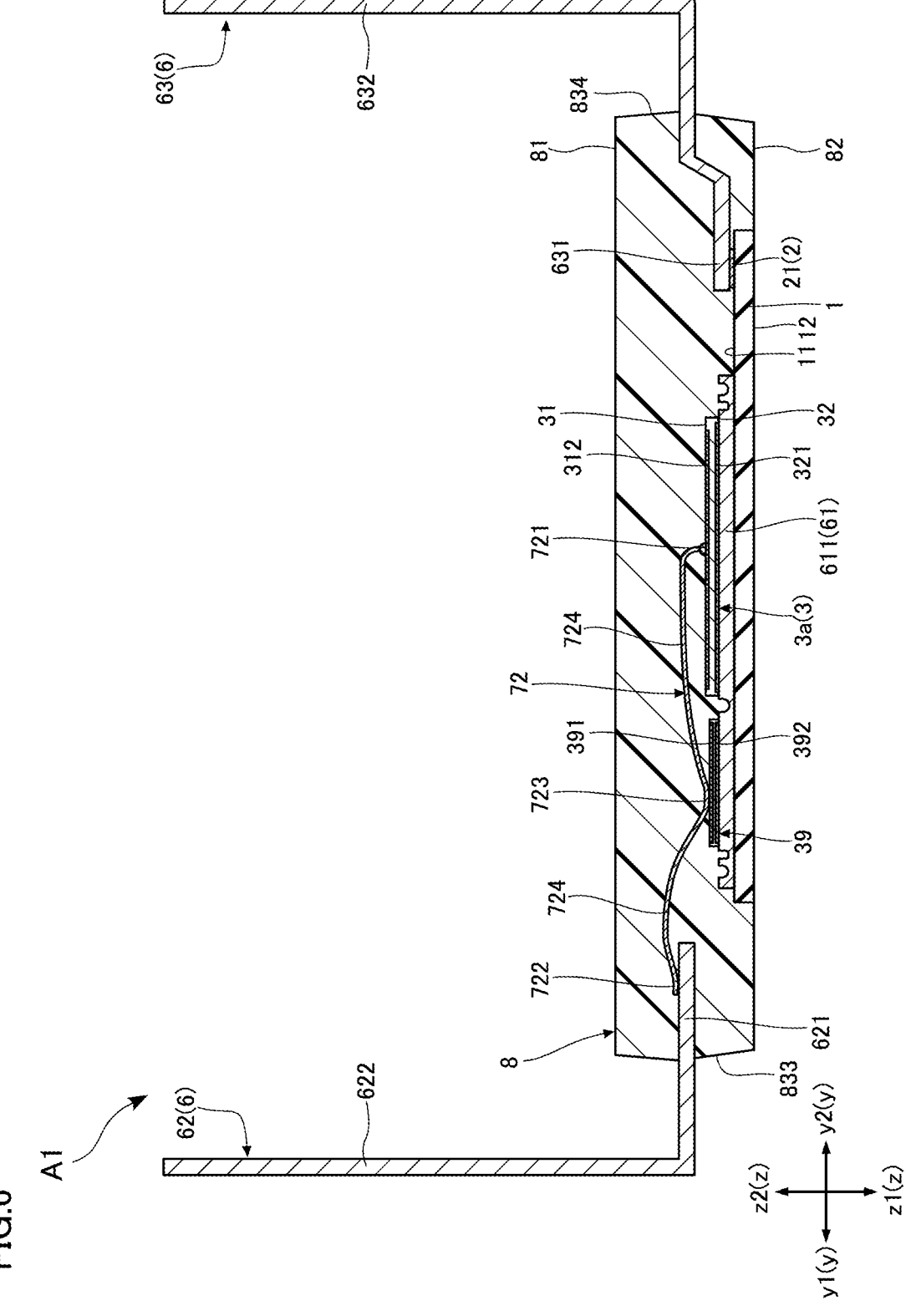
FIG. 6 is a cross-sectional view taken along line VI-VI in FIG. 3.
Figure 7:
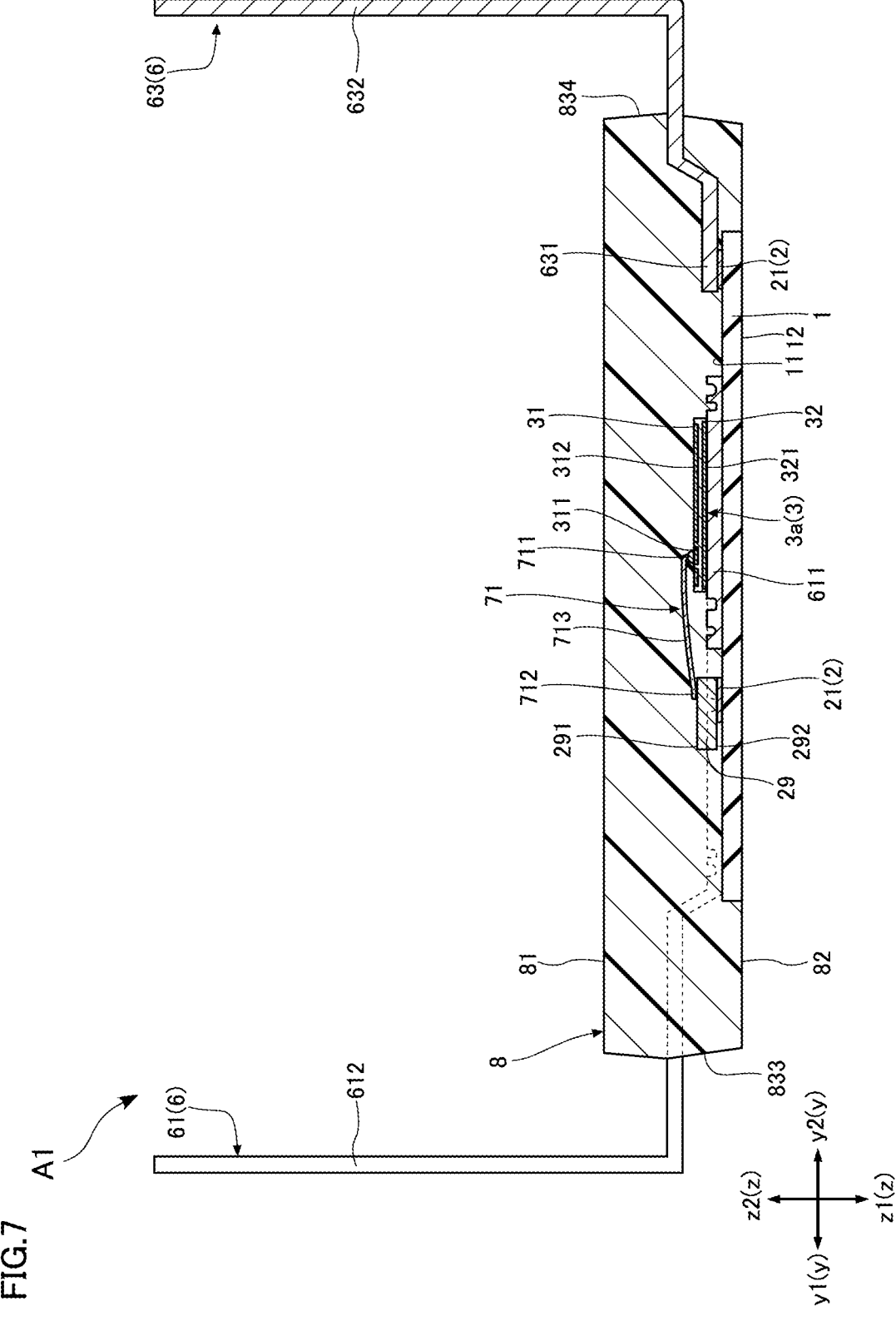
FIG. 7 is a cross-sectional view taken along line VII-VII in FIG. 3.
Figure 8:
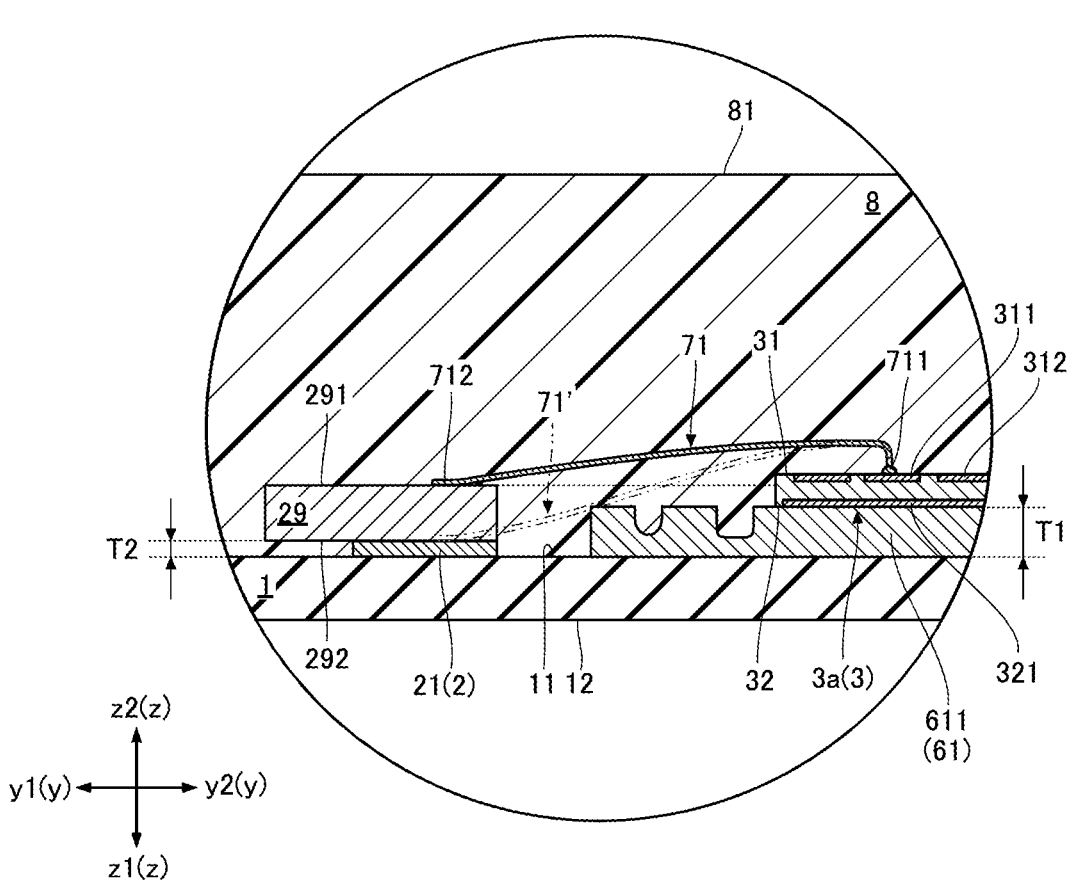
FIG. 8 is an enlarged cross-sectional view of a portion of FIG. 7.
Figure 9:
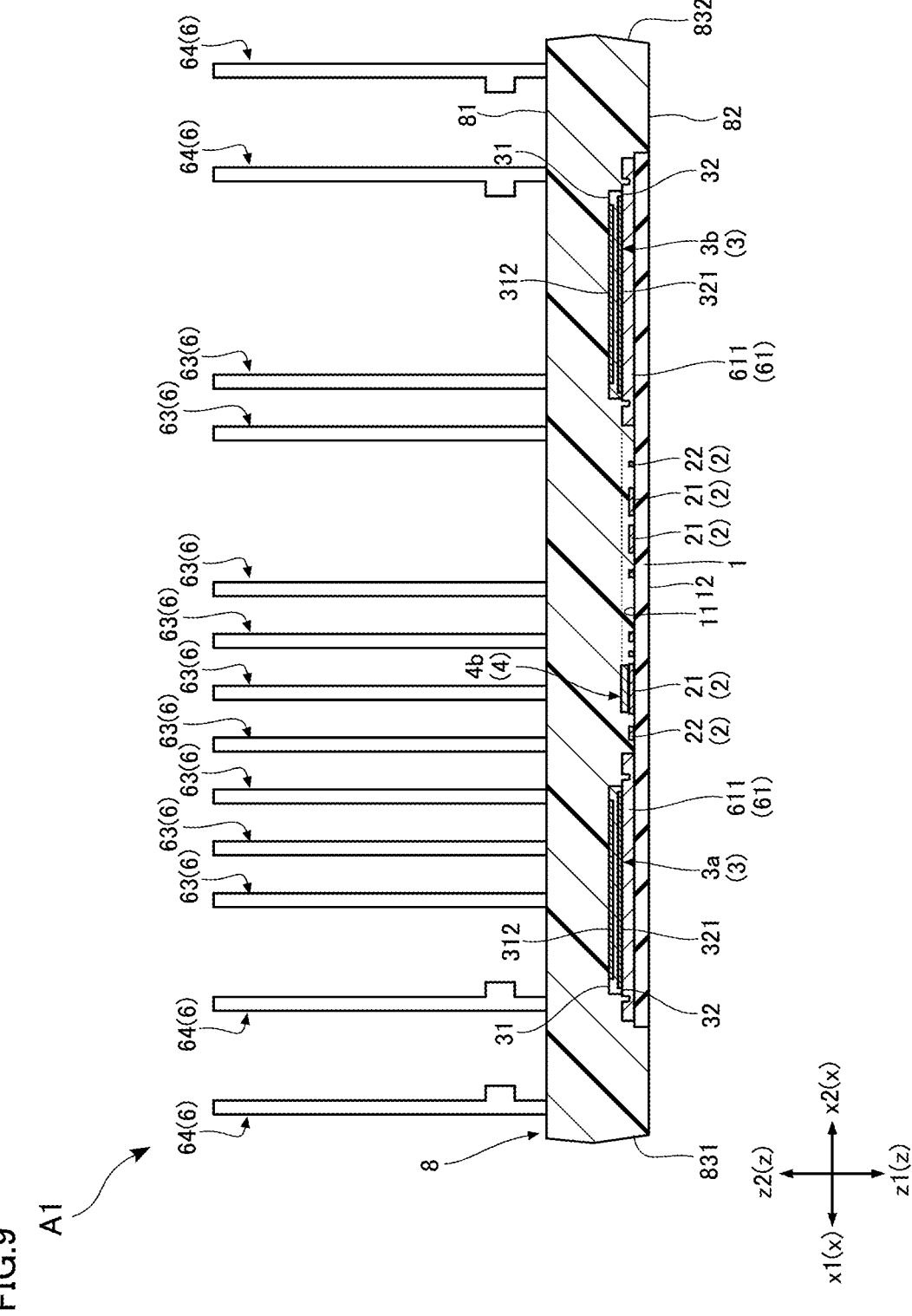
FIG. 9 is a cross-sectional view taken along line IX-IX in FIG. 3.

FIG. 1 is a perspective view showing the electronic device A1. FIG. 2 is a plan view showing the electronic device A1. FIG. 3 is a plan view corresponding to FIG. 2, in which the resin member 8 is shown using an imaginary line (two-dot chain line). FIG. 4 is a bottom view showing the electronic device A1. FIG. 5 is a side view (left side view) showing the electronic device A1. FIG. 6 is a cross-sectional view taken along line VI-VI in FIG. 3. FIG. 7 is a cross-sectional view taken along line VII-VII in FIG. 3. FIG. 8 is an enlarged cross-sectional view of a portion of FIG. 7. FIG. 9 is a cross-sectional view taken along line IX-IX in FIG. 3. In FIG. 9, the first connecting members 71 and the third connecting members 73 are omitted.

For the sake of convenience of description, three mutually orthogonal directions (an x direction, a y direction, and a z direction) will be referred to. The z direction corresponds to a thickness direction of the electronic device A1. The x direction and the y direction are included in a plan view (e.g., FIG. 3) of the electronic device A1. When two orientations in the x direction are distinguished, one of the orientations will be referred to as an x1 direction, and the other will be referred to as an x2 direction. Similar can be said for a y1 direction and a y2 direction, and a z1 direction and a z2 direction. In the present disclosure, a view in (taken along) the z direction will also be referred to as a "plan view".

As shown in FIGS. 4 and 6, for example, the substrate 1 has a relatively small length (thickness) in the z direction compared with its length in the x direction or the y direction. In the illustrated example, the substrate 1 has a rectangular shape that is elongated in the x direction in a plan view. The thickness of the substrate 1 is, for example, at least 0.1 mm and not larger than 1.0 mm, but the present disclosure is not limited to this example. Dimensions (length, width, thickness) of the substrate 1 are not specifically limited. The substrate 1 is made of a material that has an insulating property. The material of the substrate 1 is preferably a material that has a higher heat conductivity than the resin member 8, for example. For example, the substrate 1 is made of a ceramic. Examples of ceramic materials include alumina ($Al_2O_3$), silicon nitride (SiN), aluminum nitride (AlN), and zirconia-containing alumina.

The substrate 1 includes a substrate obverse surface 11 and a substrate reverse surface 12. The substrate obverse surface 11 and the substrate reverse surface 12 are spaced apart from each other in the z direction. The substrate obverse surface 11 faces the z2 direction, and the substrate reverse surface 12 faces the z1 direction. Each of the substrate obverse surface 11 and the substrate reverse surface 12 is a flat surface that is orthogonal to the z direction, but the present disclosure is not limited to this configuration. The wiring portions 2 are formed on the substrate obverse surface 11, and the plurality of first leads 61, the plurality of third leads 63, and a plurality of electronic components are mounted on the substrate obverse surface 11. The plurality of electronic components include the two electronic elements 3 and the two control elements 4. The substrate reverse surface 12 is exposed from the resin member 8. Each of the substrate obverse surface 11 and the substrate reverse surface 12 has a rectangular shape in a plan view, for example. There is no limitation on the shape of the substrate 1 in a plan view.

The wiring portions 2 are formed on the substrate obverse surface 11. The wiring portions 2 are made of a conductive material. For example, silver (Ag) or an Ag alloy (e.g., Ag—Pt or AgPd) is used as a constituent material of the wiring portions 2. Instead of Ag or an Ag alloy, copper (Cu), a Cu alloy, gold (Au), an Au alloy, or the like may be used as the constituent material. The wiring portions 2 are formed by printing a paste material that contains the above-described constituent material, and then firing the paste material, but the present disclosure is not limited to this example. The wiring portions 2 are conduction paths to the control elements 4. Various control signals for controlling the electronic elements 3 pass through the wiring portions 2. The control signals include driving signals, detection signals, and the like. The driving signals are signals for controlling driving of the electronic elements 3. The detection signals are signals for detecting operation states (e.g., a voltage value, a current value, etc.) of the electronic elements 3.

The wiring portions 2 include a plurality of pad portions 21 and a plurality of connection wires 22 as shown in FIG. 3. Each of the plurality of pad portions 21 has a rectangular shape in a plan view. The plurality of pad portions 21 are spaced apart from each other. The plurality of pad portions 21 are portions to which other components are joined. In the electronic device A1, a plurality of conduction members 29, the plurality of control elements 4, the plurality of passive elements 5, the plurality of third leads 63, the plurality of fourth leads 64, and the plurality of third connecting members 73 are joined to the pad portions 21. The plurality of connection wires 22 connect the plurality of pad portions 21 such that conduction paths in the electronic device A1 form a desired circuit configuration.

Each of the plurality of conduction members 29 is a rectangular parallelepiped block, for example, and has a rectangular shape in a plan view. Each conduction member 29 is formed of Cu, for example. Another conductive material may be used instead of Cu. For example, a metal other than Cu or a semiconductor material (e.g., Si) that is doped with an impurity to increase electrical conductivity may be used.

Each of the plurality of conduction members 29 includes an obverse surface 291 and a reverse surface 292. The obverse surface 291 and the reverse surface 292 are spaced apart from each other in the z direction. The obverse surface 291 faces the z2 direction, and the reverse surface 292 faces the z1 direction. Each of the obverse surface 291 and the reverse surface 292 is a flat surface that is orthogonal to the z direction, but the present disclosure is not limited to this configuration. A first connecting member 71 is joined to the obverse surface 291. Thus, the conduction member 29 is electrically connected to the first connecting member 71.

Each conduction member 29 and an electronic element 3 that is electrically connected to the conduction member 29 are arranged in an orthogonal direction that is orthogonal to the z direction. In the example shown in FIG. 3, the orthogonal direction corresponds to the direction in which the first connecting member 71 electrically connecting the conduction member 29 and the electronic element 3 extends. The obverse surface 291 overlaps with the electronic element 3 as viewed in the orthogonal direction, for example. The thickness (length in the z direction) of the conduction member 29 is larger than a difference between the thickness of the wiring portions 2 and the thickness of the first leads 61. Preferably, the obverse surface 291 overlaps with the obverse surface (the element obverse surface 31 described above) of the electronic element 3. The obverse surface 291 may be located above (in the z2 direction with respect to) each electronic element 3 in the z direction.

Each conduction member 29 is joined to a pad portion 21 (wiring portion 2) using a conductive joining material (not shown). For example, solder, a metal paste (a silver paste, a copper paste, etc.), a sintered metal (sintered silver), or the like is used as the conductive joining material. In the state in which the conduction member 29 is joined to the pad portion 21, the reverse surface 292 faces the pad portion 21. The method for joining the conduction member 29 and the pad portion 21 may be another method such as ultrasonic joining or laser joining. In the example shown in FIG. 3, each conduction member 29 is larger than the pad portion 21 to which the conduction member 29 is joined, in a plan view. Alternatively, the conduction member 29 may have the same size as the pad portion 21 (including a case where sizes of the conduction member 29 and the pad portion 21 are substantially the same), or the conduction member 29 may be smaller than the pad portion 21.

The two electronic elements 3 are arranged on the first leads 61 (first pad portions 611), respectively. When the two electronic elements 3 are distinguished, one of the electronic elements 3 will be referred to as an electronic element 3a, and the other of the electronic elements 3 will be referred to as an electronic element 3b. Each electronic element 3 is, for example, a power transistor that controls power. Each electronic element 3 is, for example, a MOSFET (Metal-Oxide-Semiconductor Field-Effect Transistor) that is constituted by a SiC (silicon carbide) substrate. Note that each electronic element 3 may be a MOSFET constituted by an Si substrate, instead of the SiC substrate, and may include an IGBT element, for example. Alternatively, each electronic element 3 may be a MOSFET that contains GaN (gallium nitride). The electronic device A1 includes the two electronic elements 3, but the number of electronic elements 3 is not limited and is changed as appropriate according to requirements for the electronic device A1.

Each electronic element 3 includes an element obverse surface 31 and an element reverse surface 32. The element obverse surface 31 and the element reverse surface 32 are spaced apart from each other in the z direction. The element obverse surface 31 faces the z2 direction, and the element reverse surface 32 faces the z1 direction. Each of the element obverse surface 31 and the element reverse surface 32 is flat, but the present disclosure is not limited to this configuration. In each electronic element 3, a first obverse surface electrode 311 and a second obverse surface electrode 312 are formed on the element obverse surface 31. The first obverse surface electrode 311 and the second obverse surface electrode 312 are spaced apart from each other. The second obverse surface electrode 312 is larger than the first obverse surface electrode 311 in a plan view. One end of each first connecting member 71 is joined to the first obverse surface electrode 311. One end of each second connecting member 72 is joined to the second obverse surface electrode 312. In each electronic element 3, a reverse surface electrode 321 is formed on the element reverse surface 32. The reverse surface electrode 321 is formed over the entire (or substantially the entire) element reverse surface 32. Each reverse surface electrode 321 is joined to the first lead 61 (first pad portion 611). In an example in which each electronic element 3 is constituted by a MOSFET, the first obverse surface electrode 311 is, for example, a gate electrode, the second obverse surface electrode 312 is, for example, a source electrode, and the reverse surface electrode 321 is, for example, a drain electrode.

A driving signal is input from the control element 4 (control element 4a, which will be described later) to the first obverse surface electrode 311, and the electronic element 3a performs a switching operation (i.e., is switched between a conducting state and an interrupting state) according to the input driving signal. In the conducting state, a current flows from the reverse surface electrode 321 (drain electrode) to the second obverse surface electrode 312 (source electrode), and in the interrupting state, such a current does not flow.

Similarly to the electronic element 3a, a driving signal is input from the control element 4 (control element 4b, which will be described later) to the first obverse surface electrode 311, and the electronic element 3b is switched between the conducting state and the interrupting state according to the input driving signal.

Two protective elements 39 are for preventing reverse voltage being applied to the electronic elements 3 respectively. Each protective element 39 is, for example, a diode. Each protective element 39 is arranged on the first lead 61 (first pad portion 611). The protective elements 39 are connected in antiparallel with the electronic elements 3. Each protective element 39 includes an obverse surface electrode 391 and a reverse surface electrode 392. The obverse surface electrode 391 is formed on the obverse surface (surface that faces the z2 direction) of the protective element 39, and the reverse surface electrode 392 is formed on the reverse surface (surface that faces the z1 direction) of the protective element 39. Second connecting members 72 are joined to the obverse surface electrode 391, and the obverse surface electrode 391 and the second obverse surface electrode 312 are electrically connected to each other via the second connecting members 72. The reverse surface electrode 392 is joined to the first lead 61, and the reverse surface electrode 392 and the reverse surface electrode 321 are electrically connected to each other via the first lead 61. In a case where each protective element 39 is a diode, the obverse surface electrode 391 is an anode electrode, and the reverse surface electrode 392 is a cathode electrode. A configuration is also possible in which the electronic device A1 does not include the protective elements 39.

The two control elements 4 control driving of the electronic elements 3, respectively. Each of the control elements 4 is arranged on the substrate obverse surface 11. When the two control elements 4 are distinguished, one of the control elements 4 will be referred to as a control element 4a, and the other of the control elements 4 will be referred to as a control element 4b.

The control element 4a controls driving of the electronic element 3a. The control element 4a controls a switching operation of the electronic element 3a by inputting a driving signal (e.g., gate voltage) to the first obverse surface electrode 311 (gate electrode) of the electronic element 3a. Each of the plurality of third connecting members 73 is joined to the control element 4a. The control element 4a is electrically connected to the first obverse surface electrode 311 of the electronic element 3a via the third connecting members 73, wiring portions 2, the conduction member 29, and the first connecting member 71. Accordingly, the driving signal output from the control element 4a is input to the first obverse surface electrode 311 of the electronic element 3a via the third connecting members 73, the wiring portions 2, the conduction member 29, and the first connecting member 71. As shown in FIG. 9, the upper surface (surface that faces the z2 direction) of the control element 4a is located in the z1 direction with respect to the element obverse surface 31 of each electronic element 3. The upper surface of the control element 4a is located at the same (or substantially the same) position in the z direction as the upper surface (surface that faces the z2 direction) of the first pad portion 611, which will be described later.

The control element 4b controls driving of the electronic element 3b. The control element 4b controls a switching operation of the electronic element 3b by inputting a driving signal (e.g., gate voltage) to the first obverse surface electrode 311 (gate electrode) of the electronic element 3b. In the present embodiment, the control element 4b constitutes a control device 40 together with a resin package 401 and a plurality of connection terminals 402. The control device 40 is an SOP (Small Outline Package) type package. The package type of the control device 40 is not limited to the SOP type, and may be another package type such as a QFP (Quad Flat Package) type, an SOJ (Small Outline J-lead Package) type, a QFN (Quad Flatpack No Lead) type, or an SON (Small-Outline No Lead) type. The resin package 401 is made of epoxy resin, for example, and covers the control element 4b. The plurality of connection terminals 402 protrude from the resin package 401 and are electrically connected to the control element 4b inside the resin package 401. The connection terminals 402 of the control element 4b are joined and electrically connected to pad portions 21 (wiring portions 2) via a conductive joining material (e.g., solder, a metal paste, or a sintered metal). The control element 4b is electrically connected to the first obverse surface electrode 311 of the electronic element 3b via the wiring portions 2, the conduction member 29, and the first connecting member 71. Accordingly, the driving signal output from the control element 4b is input to the first obverse surface electrode 311 of the electronic element 3b via the wiring portions 2, the conduction member 29, and the first connecting member 71.

Each of the plurality of passive elements 5 is arranged on the substrate obverse surface 11 of the substrate 1 and is joined to a pad portion 21 (wiring portion 2). The plurality of passive elements 5 are, for example, resistors, capacitors, coils, diodes, or the like. The plurality of passive elements 5 include thermistors 5a.

Each thermistor 5a is joined and electrically connected to two pad portions 21 of wiring portions 2. The pad portions 21 are electrically connected to two different fourth leads 64, respectively, via the wiring portions 2. Each thermistor 5a outputs a current corresponding to ambient temperature as a result of voltage being applied between the two third leads 63.

Each of the plurality of leads 6 is constituted by a material that contains metal. Preferably, each lead 6 has a higher heat conductivity than the substrate 1. For example, each lead 6 is constituted by copper (Cu), aluminum, iron (Fe), oxygen-free copper, or an alloy of any of these metals (e.g., a Cu—Sn alloy, a Cu—Zr alloy, a Cu—Fe alloy, etc.). Surfaces of the leads 6 may be plated (e.g., plated with nickel). The plurality of leads 6 may be formed through pressing in which a mold is pressed against a metal plate, or by etching a metal plate, for example. The thickness (length in the z direction) of each lead 6 is not particularly limited, but is, for example, at least 0.4 mm and not larger than 0.8 mm. The plurality of leads 6 are spaced apart from each other. Each lead 6 includes a portion that is covered by the resin member 8 and a portion that is exposed from the resin member 8.

Each of the plurality of first leads 61 is supported by the resin member 8 and the substrate 1. Each first lead 61 includes the first pad portion 611 and a first terminal portion 612. In each first lead 61, the first pad portion 611 and the first terminal portion 612 are electrically connected to each other.

Each first pad portion 611 is covered by the resin member 8. Each first pad portion 611 is arranged on the substrate obverse surface 11 of the substrate 1 and overlaps with the substrate 1 in a plan view. Each first pad portion 611 is joined to the substrate obverse surface 11 using a joining material (not shown). A metal layer may be provided on the substrate obverse surface 11 to which the first pad portions 611 are joined, to increase the strength of joining between each of the first pad portions 611 and the substrate 1. If the metal layer is made of the same material as the wiring portions 2, the metal layer can be formed together with the wiring portions 2.

The pair of electronic elements 3 and the protective elements 39 are mounted on the first pad portions 611. The reverse surface electrode 321 (drain electrode) of each electronic element 3 and the reverse surface electrode 392 (cathode electrode) of each protective element 39 are joined and electrically connected to the first pad portion 611 using a conductive joining material (not shown). The conductive joining material is, for example, solder, a metal paste, or a sintered metal. As a result, the reverse surface electrode 321 of the electronic element 3 and the reverse surface electrode 392 of the protective element 39 are electrically connected to each other. The element reverse surface 32 of each electronic element 3 and the reverse surface (surface facing the z1 direction) of each protective element 39 face the first pad portion 611. As shown in FIG. 8, the thickness (length in the z direction) T1 of each first pad portion 611 is larger than the thickness (length in the z direction) T2 of the wiring portions 2.

Each first terminal portion 612 is exposed from the resin member 8. Each first terminal portion 612 is bent in the z2 direction. The first terminal portions 612 are external terminals of the electronic device A1. Each first pad portion 611 is electrically connected to the reverse surface electrode 321 of the electronic element 3, and accordingly, a drain current of the electronic element 3 flows through each first terminal portion 612.

Each of the plurality of second leads 62 is supported by the resin member 8. Each second lead 62 includes a second pad portion 621 and a second terminal portion 622. In each second lead 62, the second pad portion 621 and the second terminal portion 622 are electrically connected to each other.

Each second pad portion 621 is covered by the resin member 8. Each second pad portion 621 does not overlap with the substrate 1 in a plan view. A plurality of second connecting members 72 are joined to each second pad portion 621. Each of the second connecting members 72 joined to the second pad portion 621 is joined to the second obverse surface electrode 312 of the electronic element 3. Thus, the second pad portion 621 is electrically connected to the second obverse surface electrode 312 (source electrode) of the electronic element 3 via the second connecting members 72.

Each second terminal portion 622 is exposed from the resin member 8. Each second terminal portion 622 is bent in the z2 direction. The second terminal portions 622 are external terminals of the electronic device A1. The second pad portion 621 is electrically connected to the second obverse surface electrode 312 (source electrode) of the electronic element 3, and accordingly, a source current of the electronic element 3 flows through the second terminal portion 622.

Each of the plurality of third leads 63 is supported by the resin member 8 and the substrate 1. Each third lead 63 includes a third pad portion 631 and a third terminal portion 632. In each third lead 63, the third pad portion 631 and the third terminal portion 632 are electrically connected to each other.

Each third pad portion 631 is covered by the resin member 8. Each third pad portion 631 is arranged on the substrate obverse surface 11 of the substrate 1 and overlaps with the substrate 1 in a plan view. Each third pad portion 631 is joined and electrically connected to a pad portion 21 of a wiring portion 2 using a conductive joining material (not shown). The pad portion 21 to which the third pad portion 631 is joined is electrically connected to the control element 4 via a connection wire 22. Accordingly, the third pad portion 631 is electrically connected to the control element 4 via the wiring portion 2.

Each third terminal portion 632 is exposed from the resin member 8. Each third terminal portion 632 is bent in the z2 direction. The third terminal portions 632 are external terminals of the electronic device A1. Each third pad portion 631 is electrically connected to the control element 4, and accordingly, each third terminal portion 632 is an input terminal for various control signals to the control element 4 or an output terminal for various control signals from the control element 4.

Each of the plurality of fourth leads 64 is supported by the resin member 8 and the substrate 1. Each fourth lead 64 includes a fourth pad portion 641 and a fourth terminal portion 642. In each fourth lead 64, the fourth pad portion 641 and the fourth terminal portion 642 are electrically connected to each other.

Each fourth pad portion 641 is covered by the resin member 8. Each fourth pad portion 641 is arranged on the substrate obverse surface 11 of the substrate 1 and overlaps with the substrate 1 in a plan view. Each fourth pad portion 641 is joined and electrically connected to a pad portion 21 of a wiring portion 2 using a conductive joining material (not shown). The pad portion 21 to which the fourth pad portion 641 is joined is electrically connected to a thermistor 5a via a connection wire 22. Accordingly, the fourth pad portion 641 is electrically connected to the thermistor 5a via the wiring portion 2.

Each fourth terminal portion 642 is exposed from the resin member 8. Each fourth terminal portion 642 is bent in the z2 direction. The fourth terminal portions 642 overlap with the third terminal portions 632 as viewed in the x direction. The fourth terminal portions 642 are external terminals of the electronic device A1. Each fourth pad portion 641 is electrically connected to the thermistor 5a, and accordingly, each fourth terminal portion 642 is a temperature detection terminal.

In the example shown in FIG. 3, a first lead 61 and a second lead 62 are provided for each of the two electronic elements 3. That is, the electronic device A1 includes two first leads 61 and two second leads 62. As the number of electronic elements 3 increases, the number of first leads 61 and the number of second leads 62 also increase. Similarly, the electronic device A1 includes four fourth leads 64 (two fourth leads 64 are provided for each of the two thermistors 5a).

Each of the plurality of first connecting members 71, the plurality of second connecting members 72, the plurality of third connecting members 73, and the fourth connecting member 74 electrically connects two members that are spaced apart from each other. In the illustrated example, the plurality of first connecting members 71, the plurality of second connecting members 72, the plurality of third connecting members 73, and the fourth connecting member 74 are wires (bonding wires).

Each of the plurality of first connecting members 71 is joined to the first obverse surface electrode 311 (gate electrode) of the electronic element 3 and the obverse surface 291 of the conduction member 29 and electrically connects the first obverse surface electrode 311 of the electronic element 3 and the conduction member 29 to each other. Each first connecting member 71 is constituted by Au, for example, but may be constituted by Cu or Al. The wire diameter of each first connecting member 71 and the number of first connecting members 71 are not limited to those illustrated in FIG. 3.

Each first connecting member 71 includes a pair of joined portions 711 and 712 and a linear portion 713. The joined portion 711 is a portion that is joined to the first obverse surface electrode 311. The joined portion 712 is a portion that is joined to the obverse surface 291 of the conduction member 29. The linear portion 713 is a portion that connects the pair of joined portions 711 and 712. The linear portion 713 extends from each of the joined portions 711 and 712.

In each first connecting member 71, the joined portion 711 is formed earlier than the joined portion 712, for example. In the example shown in FIGS. 7 and 8, each first connecting member 71 is formed using a wire bonding device in which a capillary is used. Specifically, the joined portion 711 is formed through ball bonding, and the joined portion 712 is formed through stitch bonding. The joined portion 711 is an example of a "preceding bonding portion", and the joined portion 712 is an example of a "succeeding bonding portion". Unlike the present embodiment, the joined portion 712 may be formed earlier than the joined portion 711. In this case, the joined portion 712 is formed through ball bonding, and the joined portion 711 is formed through stitch bonding. Also, each first connecting member 71 may be formed using a wire bonding device in which a wedge tool is used instead of a capillary. In this case, each of the joined portion 711 and the joined portion 712 is formed through wedge bonding.

Each of the plurality of second connecting members 72 is joined to the second obverse surface electrode 312 (source electrode) of the electronic element 3 and the second pad portion 621 of the second lead 62, and electrically connects the second obverse surface electrode 312 and the second lead 62 to each other. Each of the plurality of second connecting members 72 is joined to the second obverse surface electrode 312 (source electrode) of the electronic element 3 and the obverse surface electrode 391 (anode electrode) of the protective element 39, and electrically connects the second obverse surface electrode 312 and the obverse surface electrode 391 to each other. Each second connecting member 72 is constituted by Al, Cu, or Au, but the present disclosure is not limited to this example. The wire diameter of each second connecting member 72 and the number of second connecting members 72 are not limited to those illustrated in FIG. 3.

As shown in FIG. 6, each second connecting member 72 includes a pair of joined portions 721 and 722, an intermediate joined portion 723, and two linear portions 724. The joined portion 721 is a portion that is joined to the second obverse surface electrode 312. The joined portion 722 is a portion that is joined to the second pad portion 621 of the second lead 62. The intermediate joined portion 723 is a portion that is joined to the obverse surface electrode 391 of the protective element 39. One of the two linear portions 724 is a portion that connects the joined portion 721 and the intermediate joined portion 723, and the other of the linear portions 724 is a portion that connects the joined portion 722 and the intermediate joined portion 723.

In the example shown in FIGS. 3 and 6, the second obverse surface electrode 312 (electronic element 3), the obverse surface electrode 391 (protective element 39), and the second pad portion 621 (second lead 62) are electrically connected to each other by a single second connecting member 72, but the present disclosure is not limited to this configuration. For example, instead of the second connecting member 72, a wire that electrically connects the second obverse surface electrode 312 and the obverse surface electrode 391 to each other and a wire that electrically connects the obverse surface electrode 391 and the second pad portion 621 to each other may be provided separately from each other. Instead of the second connecting member 72, a wire that electrically connects the second obverse surface electrode 312 and the second pad portion 621 to each other and a wire that electrically connects the second obverse surface electrode 312 and the obverse surface electrode 391 may be provided.

Each of the plurality of third connecting members 73 is joined to the control element 4a and a pad portion 21 of a wiring portion 2, and electrically connects the control element 4 and the wiring portion 2 to each other. Each third connecting member 73 is constituted by Au, Cu, or Al, for example. The wire diameter of each third connecting member 73 and the number of third connecting members 73 are not limited to those illustrated in FIG. 3.

The fourth connecting member 74 is joined to the second obverse surface electrode 312 of the electronic element 3b and the obverse surface 291 of the conduction member 29, and electrically connects the second obverse surface electrode 312 and the conduction member 29 to each other. The conduction member 29 is electrically connected to a wiring portion 2, and accordingly, a detection signal for detecting a current (e.g., source current) flowing through the second obverse surface electrode 312 of the electronic element 3b is transmitted to the wiring portion 2. The fourth connecting member 74 is constituted by Au, Cu, or Al. The wire diameter of the fourth connecting member 74 is not limited to that illustrated in FIG. 3. It is also possible to use a plurality of fourth connecting members 74. Similarly to each first connecting member 71, in the fourth connecting member 74, a portion that is joined to the second obverse surface electrode 312 is formed earlier than a portion that is joined to the obverse surface 291. These portions may be formed in the opposite order. The fourth connecting member 74 may be formed using a wire bonding device in which a capillary is used, or a wire bonding device in which a wedge tool is used.

The resin member 8 covers the substrate 1 (except for the substrate reverse surface 12), the wiring portions 2, the two electronic elements 3, the two control elements 4 (control device 40), the plurality of passive elements 5, portions of the plurality of leads 6, the plurality of first connecting members 71, the plurality of second connecting members 72, the plurality of third connecting members 73, and the fourth connecting member 74. For example, a material that has an insulating property such as an epoxy resin or silicone gel is used as a constituent material of the resin member 8. The resin member 8 is formed through molding, for example.

The resin member 8 includes a resin obverse surface 81, a resin reverse surface 82, and a plurality of resin side surfaces 831 to 834. The resin obverse surface 81 and the resin reverse surface 82 are spaced apart from each other in the z direction. The resin obverse surface 81 faces the z2 direction, and the resin reverse surface 82 faces the z1 direction. Each of the resin obverse surface 81 and the resin reverse surface 82 is a flat surface that is orthogonal to the z direction, but the present disclosure is not limited to this configuration. The substrate reverse surface 12 is exposed from the resin reverse surface 82. In the present embodiment, the substrate reverse surface 12 and the resin reverse surface 82 are flush with each other as shown in FIGS. 6, 7, and 9, but the present disclosure is not limited to this configuration. Each of the plurality of resin side surfaces 831 to 834 is continuous to the resin obverse surface 81 and the resin reverse surface 82. The two resin side surfaces 831 and 832 are spaced apart from each other in the x direction. The resin side surface 831 faces the x1 direction, and the resin side surface 832 faces the x2 direction. The two resin side surfaces 833 and 834 are spaced apart from each other in the y direction. The resin side surface 833 faces the y1 direction, and the resin side surface 834 faces the y2 direction. In the illustrated example, a center portion (or a portion near the center) in the z direction of each of the resin side surfaces 831 to 834 is bent, but the present disclosure is not limited to this configuration. For example, each of the resin side surfaces 831 to 834 may be flat as a whole or may be curved with a predetermined curvature.

In the electronic device A1, the plurality of first leads 61 and the plurality of second leads 62 protrude from the resin side surface 833, and the plurality of third leads 63 and the plurality of fourth leads 64 protrude from the resin side surface 834. That is, terminals for power, which are electrically connected to the electronic elements 3, and terminals for control signals, which are electrically connected to the control elements 4, protrude from opposite side surfaces.

The following describes functions and effects of the electronic device A1.

The electronic device A1 includes the wiring portions 2 that are formed on the substrate 1 (substrate obverse surface 11). The wiring portions 2 constitute paths for transmitting controls signals (e.g., driving signals) for controlling the electronic elements 3. Specifically, for example, a driving signal for the electronic element 3 is output from the control element 4 and is input to the first obverse surface electrode 311 via the wiring portions 2, the conduction member 29, and the first connecting member 71. The wiring portions 2 are formed by, for example, printing a silver paste in a predetermined pattern on the substrate 1 and then firing the silver paste. With this configuration, it is possible to make the transmission paths thin and increase the density of the transmission paths, unlike a case where the transmission paths are constituted by metal lead frames. Therefore, the integration density of the electronic device A1 can be increased.

The electronic device A1 includes the conduction member 29 that is electrically connected to a wiring portion 2. Also, the electronic element 3 (first obverse surface electrode 311 thereof) and the conduction member 29 (obverse surface 291 thereof) are electrically connected to each other using the first connecting member 71. Commonly, the first connecting member 71 constituted by a bonding wire has a relatively large inductance component and may cause generation of noise. However, in the electronic device A1, the first connecting member 71 is not directly joined to the wiring portion 2, but is joined to the conduction member 29 (having a smaller inductance component than the first connecting member 71) constituted by a block. With this configuration, it is possible to make the length of the first connecting member 71 short (i.e., reduce the inductance component), and consequently suppress the generation of noise.

For comparison, assume a configuration in which the conduction member 29 is not provided, unlike the electronic device A1. In this case, a first connecting member 71' is directly connected to the first obverse surface electrode 311 of the electronic element 3 and the wiring portion 2 as shown using an imaginary line (two-dot chain line) in FIG. 8, for example. However, as shown in FIG. 8, the first connecting member 71' is likely to come into contact with the first pad portion 611 and there is a possibility that an unintended short circuit will occur. A cause of the first connecting member 71' coming into contact with the first pad portion 611 is that the height difference between the upper surface (element obverse surface 31) of the first obverse surface electrode 311 and the upper surface of the pad portion 21 is large. In contrast, in the electronic device A1, the above-described height difference is reduced by providing the conduction member 29 and joining the first connecting member 71 to the first obverse surface electrode 311 of the electronic element 3 and the obverse surface 291 of the conduction member 29. As a result, the first connecting member 71 can be kept from coming into contact with the first pad portion 611. That is, the electronic device A1 suppresses the occurrence of an unintended short circuit and has improved reliability. In particular, in the electronic device A1, the obverse surface 291 of the conduction member 29 overlaps with the electronic element 3 in the horizontal direction (orthogonal direction that is orthogonal to the z direction). The orthogonal direction corresponds to the direction in which the conduction member 29 and the electronic element 3 electrically connected to the conduction member 29 are arranged. In this case, the entirety of the first connecting member 71 is located above (in the z2 direction with respect to) the first pad portion 611, and therefore, contact between the first connecting member 71 and the first pad portion 611 can be reliably avoided.

As a method for avoiding contact between the first connecting member 71 and the first pad portion 611 without providing the conduction member 29, the following alternative method can be considered, for example. That is, it is conceivable to increase the length of the linear portion 713 of the first connecting member 71 so that the linear portion will be sufficiently spaced apart from the first pad portion 611 in the z direction. However, in this alternative method, the entire length of the first connecting member 71 is increased, and therefore, the inductance component increases. Also, depending on the wire diameter and the constituent material (e.g., Au or Cu) of the first connecting member 71, the first connecting member 71 may be pressed down by molding resin that is poured to form the resin member 8, and this may cause a conduction failure such as disconnection or an unintended short circuit. In view of this, the configuration of the electronic device A1 is advantageous in terms of suppressing an increase in the inductance component and suppressing a conduction failure.

In the electronic device A1, each electronic element 3 is joined to the first pad portion 611, and the reverse surface electrode 321 of the electronic element 3 and the first lead 61 are electrically connected to each other. Also, the second obverse surface electrode 312 of the electronic element 3 is electrically connected to the second lead 62 via the plurality of second connecting members 72. With this configuration, paths through which a relatively large current flows to the electronic element 3 can be constituted by the first lead 61 and the second lead 62. This is advantageous because an allowable current amount can be increased when compared with a case where the current paths to the electronic element 3 are constituted by wiring portions 2. That is, it is possible to increase the integration density of the electronic device A1 while securing allowable current to the electronic element 3.

In the electronic device A1, the two first leads 61 have a higher heat conductivity than the substrate 1. Therefore, it is possible to suppress a reduction in a heat dissipation amount from each electronic element 3. In particular, the electronic elements 3 are mounted on the first pad portions 611 of the first leads 61, and therefore, heat can be efficiently transmitted from the electronic elements 3 to the first leads 61. Also, the first leads 61 are exposed from the resin member 8, and accordingly, the first leads 61 constitute conduction paths from the outside to the electronic elements 3, and heat dissipation properties of the electronic elements 3 can be further enhanced. Furthermore, the substrate reverse surface 12 of the substrate 1 is exposed from the resin member 8 (resin reverse surface 82), and therefore, heat conducted from the electronic elements 3 to the substrate 1 can be efficiently dissipated to the outside.

In the electronic device A1, the control device 40 includes the resin package 401 that covers the control element 4b. If the resin package that covers the control element 4b is not used, a high voltage large current that is required in shipment inspection cannot be passed through the control element 4b. Therefore, shipment inspection cannot be performed until a complete product including the resin member 8 is obtained. In this case, if the control element 4b is determined as being defective in the shipment inspection, the whole complete product will be discarded even if components other than the control element 4b are work properly. On the other hand, in the control device 40, the control element 4b is covered by the resin package 401, and therefore, a high voltage large current required in the shipment inspection can be passed through the control element 4b. Accordingly, it is possible to inspect the control device 40 before the complete product is manufactured, and if the control element 4b is defective, it is possible to discard only the control device 40.

Figure 10:
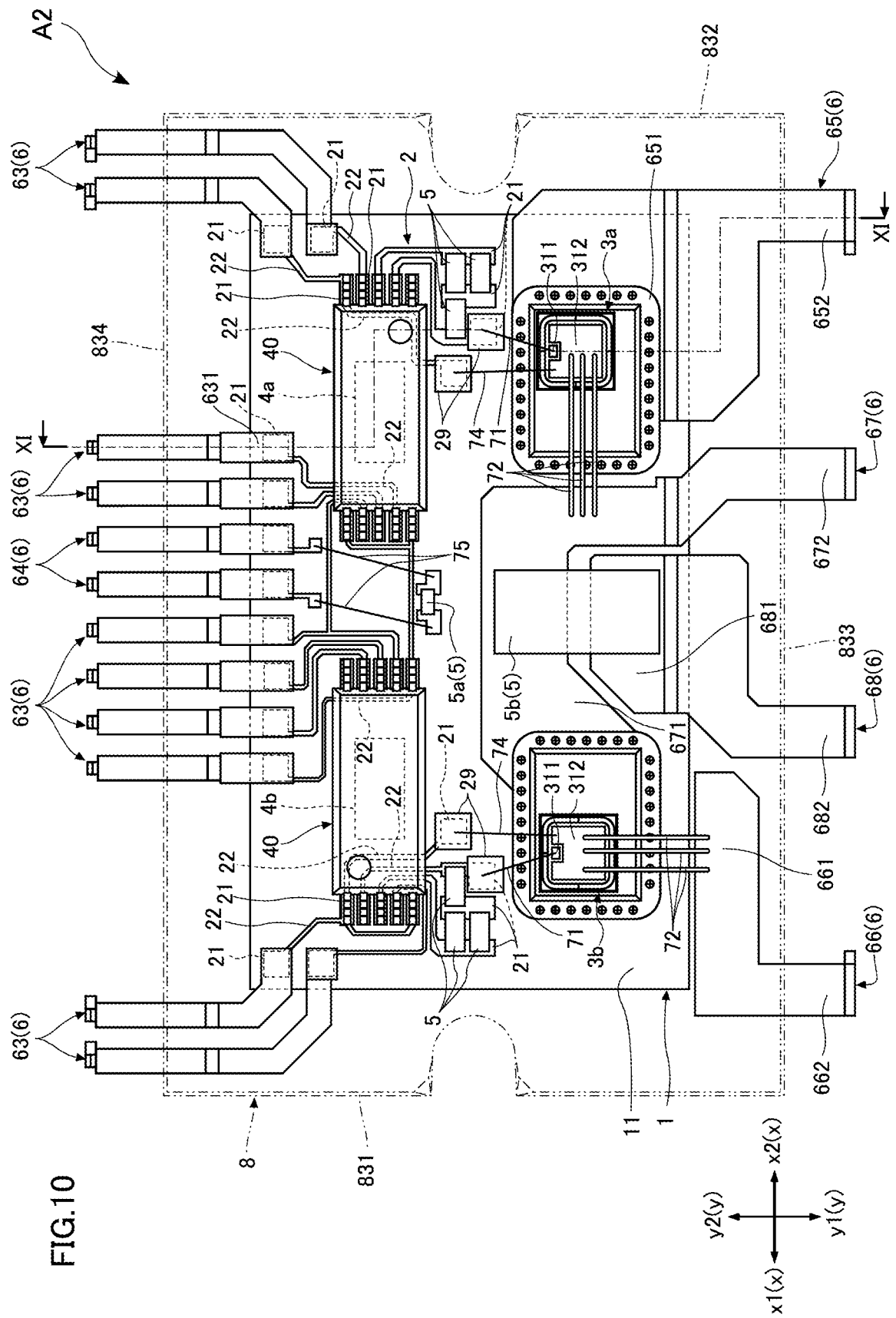
FIG. 10 is a plan view showing an electronic device according to a second embodiment, in which the resin member is shown using an imaginary line.
Figure 11:
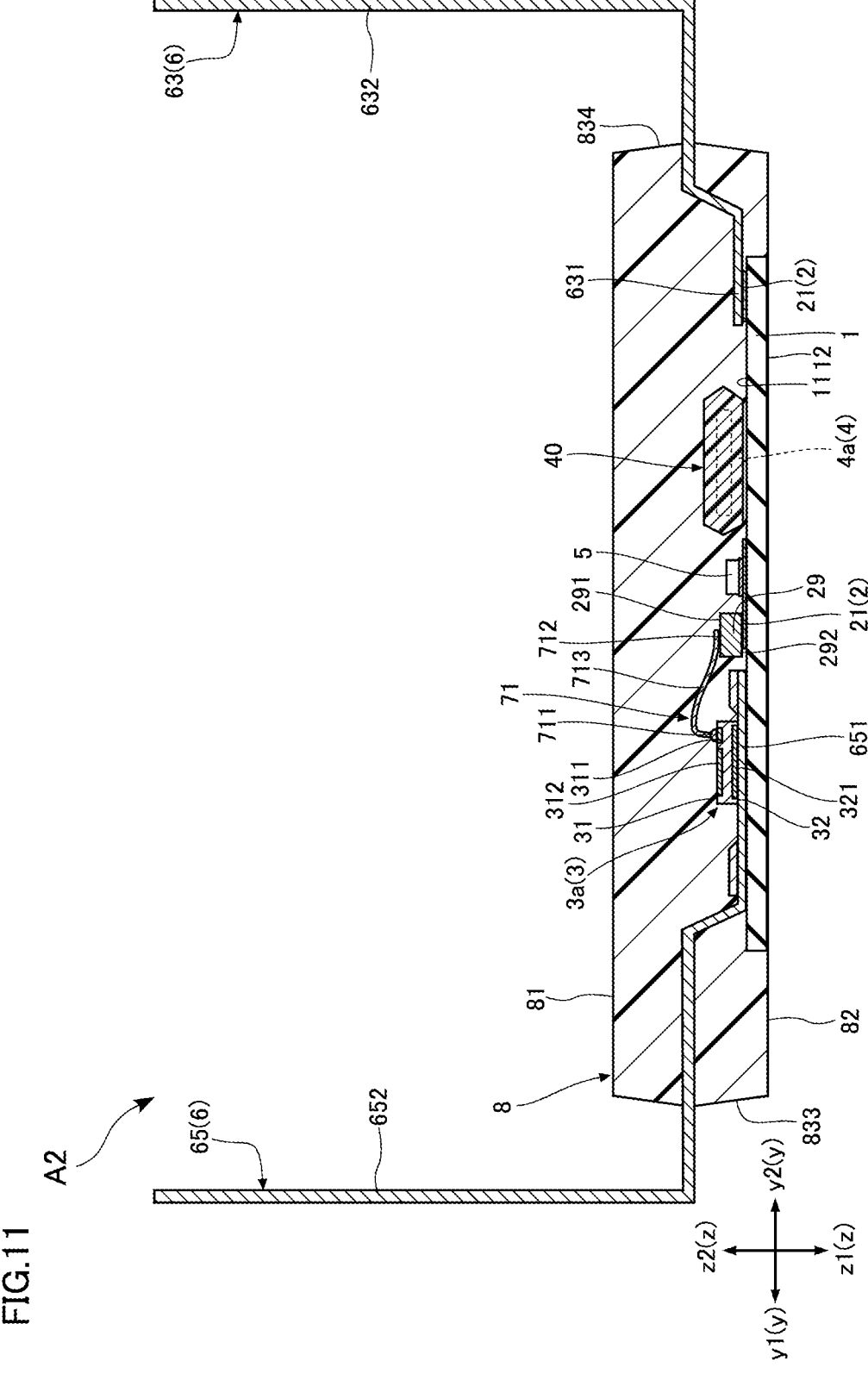
FIG. 11 is a cross-sectional view taken along line XI-XI in FIG. 10.

An electronic device A2 according to a second embodiment will be described with reference to FIGS. 10 and 11. FIG. 10 is a plan view of the electronic device A2, in which the resin member 8 is shown using an imaginary line. FIG. 11 is a cross-sectional view taken along line XI-XI in FIG. 10.

As shown in FIG. 10, unlike the electronic device A1, in the electronic device A2, the two electronic elements 3 are electrically connected to each other. As described later, in the electronic device A2, the two electronic elements 3 are connected to each other and constitute a leg. The electronic element 3a constitutes an upper arm circuit of the leg, and the electronic element 3b constitutes a lower arm circuit of the leg.

In the electronic device A2, a plurality of leads 6 include a plurality of third leads 63, a plurality of fourth leads 64, two input leads 65 and 66, an output lead 67, and a detection lead 68. The two input leads 65 and 66, the output lead 67, and the detection lead 68 each include a portion that is covered by the resin member 8 and a portion that is exposed from the resin member 8.

The input lead 65 is supported by the resin member 8 and the substrate 1. The input lead 65 includes a pad portion 651 and a terminal portion 652. In the input lead 65, the pad portion 651 and the terminal portion 652 are electrically connected to each other.

The pad portion 651 is covered by the resin member 8. The pad portion 651 is arranged on the substrate obverse surface 11 and overlaps with the substrate 1 in a plan view. The pad portion 651 is joined to the substrate obverse surface 11 using a joining material (not shown), for example. A metal layer may be provided between the pad portion 651 and the substrate obverse surface 11 to increase the strength of joining between the pad portion 651 and the substrate 1. The metal layer is made of the same material as the wiring portions 2, for example. In this case, the metal layer can be formed together with the wiring portions 2.

The electronic element 3a is mounted on the pad portion 651. The pad portion 651 and the reverse surface electrode 321 (drain electrode) of the electronic element 3a are joined and electrically connected to each other using a conductive joining material (not shown). The conductive joining material is, for example, solder, a metal paste, or a sintered metal. The element reverse surface 32 of the electronic element 3a faces the pad portion 651.

The terminal portion 652 is exposed from the resin member 8. The terminal portion 652 is bent in the z2 direction at a position that is spaced away from the resin member 8 by a predetermined distance. The terminal portion 652 is an external terminal of the electronic device A2. The pad portion 651 is electrically connected to the reverse surface electrode 321 of the electronic element 3a, and accordingly, a drain current of the electronic element 3a flows through the terminal portion 652.

The input lead 66 is supported by the resin member 8. The input lead 66 includes a pad portion 661 and a terminal portion 662. In the input lead 66, the pad portion 661 and the terminal portion 662 are electrically connected to each other.

The pad portion 661 is covered by the resin member 8. The pad portion 661 does not overlap with the substrate 1 in a plan view. A plurality of second connecting members 72 are joined to the pad portion 661. Each of the second connecting members 72 joined to the pad portion 661 is also joined to the second obverse surface electrode 312 of the electronic element 3b. Thus, the pad portion 661 is electrically connected to the second obverse surface electrode 312 (source electrode) of the electronic element 3b via the second connecting members 72.

The terminal portion 662 is exposed from the resin member 8. The terminal portion 662 is bent in the z2 direction at a position that is spaced away from the resin member 8 by a predetermined distance. The terminal portion 662 is an external terminal of the electronic device A2. The pad portion 661 is electrically connected to the second obverse surface electrode 312 (source electrode) of the electronic element 3b, and accordingly, a source current of the electronic element 3b flows through the terminal portion 662.

The output lead 67 is supported by the resin member 8 and the substrate 1. The output lead 67 includes a pad portion 671 and a terminal portion 672. In the output lead 67, the pad portion 671 and the terminal portion 672 are electrically connected to each other.

The pad portion 671 is covered by the resin member 8. The pad portion 671 is arranged on the substrate obverse surface 11 and overlaps with the substrate 1 in a plan view. The pad portion 671 is joined to the substrate obverse surface 11 using a joining material (not shown). A metal layer may be provided between the pad portion 671 and the substrate obverse surface 11 to increase the strength of joining between the pad portion 671 and the substrate 1. The metal layer is made of the same material as the wiring portions 2, for example. In this case, the metal layer can be formed together with the wiring portions 2.

The electronic element 3b is mounted on the pad portion 671. The pad portion 671 and the reverse surface electrode 321 (drain electrode) of the electronic element 3b are joined and electrically connected to each other using a conductive joining material (not shown). The conductive joining material is, for example, solder, a metal paste, or a sintered metal. The element reverse surface 32 of the electronic element 3b faces the pad portion 671. Also, a plurality of second connecting members 72 are joined to the pad portion 671. Each of the second connecting members 72 joined to the pad portion 671 is also joined to the second obverse surface electrode 312 of the electronic element 3a. Thus, the pad portion 671 is electrically connected to the second obverse surface electrode 312 (source electrode) of the electronic element 3a via the second connecting members 72.

The terminal portion 672 is exposed from the resin member 8. The terminal portion 672 is bent in the z2 direction at a position that is spaced away from the resin member 8 by a predetermined distance. The terminal portion 672 is an external terminal of the electronic device A2. The pad portion 671 is electrically connected to the reverse surface electrode 321 (drain electrode) of the electronic element 3b, and accordingly, a drain current of the electronic element 3b flows through the terminal portion 672. Also, the pad portion 671 is electrically connected to the second obverse surface electrode 312 (source electrode) of the electronic element 3a, and accordingly, a source current of the electronic element 3a flows through the terminal portion 672.

In the electronic device A2, for example, power supply voltage is applied between the two input leads 65 and 66. The input lead 65 is a positive electrode (P terminal) and the input lead 66 is a negative electrode (N terminal). The power supply voltage input between the two input leads 65 and 66 is converted to AC power (voltage) through switching operations of the two electronic elements 3a and 3b. The AC power is output from the output lead 67. As described above, the two input leads 65 and 66 are input terminals for the power supply voltage and the output lead 67 is an output terminal for the AC power of which the voltage has been converted by the two electronic elements 3a and 3b.

The detection lead 68 is supported by the resin member 8 and the substrate 1. The detection lead 68 includes a pad portion 681 and a terminal portion 682. In the detection lead 68, the pad portion 681 and the terminal portion 682 are electrically connected to each other.

The pad portion 681 is covered by the resin member 8. The pad portion 681 is arranged on the substrate obverse surface 11 and overlaps with the substrate 1 in a plan view. The pad portion 681 is joined to the substrate obverse surface 11 using a joining material (not shown). A metal layer may be provided between the pad portion 681 and the substrate obverse surface 11 to increase the strength of joining between the pad portion 681 and the substrate 1. The metal layer is made of the same material as the wiring portions 2, for example. In this case, the metal layer can be formed together with the wiring portions 2.

One of a plurality of passive elements 5 is joined to the pad portion 681. In the illustrated example, a shunt resistor 5b is joined to the pad portion 681. The shunt resistor 5b is arranged spanning the pad portion 671 (output lead 67) and the pad portion 681 (detection lead 68), and is joined and electrically connected to the pad portion 671 and the pad portion 681. A current flowing to the output lead 67 is diverted by the shunt resistor 5b and transmitted to the pad portion 681.

The terminal portion 682 is exposed from the resin member 8. The terminal portion 682 is bent in the z2 direction at a position that is spaced away from the resin member 8 by a predetermined distance. The terminal portion 682 is an external terminal of the electronic device A2. The pad portion 681 is electrically connected to the pad portion 671 via the shunt resistor 5b, and accordingly, a current diverted from the output lead 67 flows to the terminal portion 682.

The electronic device A2 includes a plurality of fifth connecting members 75. Similarly to the first to the fourth connecting members 71 to 74, the fifth connecting members 75 are bonding wires. The fifth connecting members 75 are constituted by Au, Cu, or Al. Wiring portions 2 that are electrically connected to the fourth leads 64 are electrically connected to wiring portions 2 that are electrically connected to a thermistor 5a, via the fifth connecting members 75.

Similarly to the electronic device A1, the electronic device A2 also includes the wiring portions 2 formed on the substrate obverse surface 11. Similarly to the electronic device A1, the wiring portions 2 transmit control signals (e.g., driving signals) for controlling the electronic elements 3 and constitute transmission paths of the control signals. Therefore, with the electronic device A2, it is possible to make the transmission paths thin, increase the density of the transmission paths, and increase the integration density.

The electronic device A2 includes the conduction members 29, and therefore, can reduce the inductance component and suppress the generation of noise. Also, the electronic device A2 includes the conduction members 29, and therefore, can suppress contact between the first connecting member 71 and the first pad portion 611 and can have improved reliability.

An electronic device according to the present disclosure is not limited to the embodiments described above. Various design changes can be made in specific configurations of portions of the electronic device according to the present disclosure. The present disclosure includes embodiments described in the following clauses.

Clause 1.

An electronic device including:

a substrate that includes a substrate obverse surface and a substrate reverse surface that are spaced apart from each other in a thickness direction;

an electronic element that includes an element obverse surface on which a first obverse surface electrode is formed;

a wiring portion that is formed on the substrate obverse surface and transmits a control signal for controlling the electronic element;

a conduction member that includes an obverse surface and a reverse surface that are spaced apart from each other in the thickness direction, the reverse surface being joined to the wiring portion;

a conductive first lead that is arranged on the substrate obverse surface; and a first connecting member that is joined to the obverse surface of the conduction member and the first obverse surface electrode, wherein the first lead includes a first pad portion that is spaced apart from the wiring portion and to which the electronic element is joined, and the wiring portion and the first obverse surface electrode are electrically connected to each other via the conduction member and the first connecting member.

Clause 2.

The electronic device according to Clause 1, wherein the first pad portion is greater in size along the thickness direction than the wiring portion.

Clause 3.

The electronic device according to Clause 2, wherein, as viewed in the thickness direction, the conduction member and the electronic element are arranged along an orthogonal direction that is orthogonal to the thickness direction, and the obverse surface of the conduction member overlaps with the electronic element as viewed in the orthogonal direction.

Clause 4.

The electronic device according to Clause 3, wherein the obverse surface of the conduction member overlaps with the element obverse surface as viewed in the orthogonal direction.

Clause 5.

The electronic device according to any one of Clauses 1 to 4, wherein the first connecting member comprises a wire.

Clause 6

The electronic device according to Clause 5, wherein the first connecting member includes a preceding bonding portion that is bonded to the first obverse surface electrode and a succeeding bonding portion that is bonded to the obverse surface of the conduction member.

Clause 7.

The electronic device according to any one of Clauses 1 to 6, wherein the electronic element includes an element reverse surface opposite to the element obverse surface, and a reverse surface electrode that is joined and electrically connected to the first pad portion is formed on the element reverse surface.

Clause 8.

The electronic device according to Clause 7, further including a conductive second lead that is spaced apart from the first lead, wherein the element obverse surface is formed with a second obverse surface electrode that is spaced apart from the first obverse surface electrode and electrically connected to the second lead.

Clause 9.

The electronic device according to Clause 8, further including a second connecting member that is joined to the second lead and the second obverse surface electrode.

Clause 10.

The electronic device according to Clause 9, wherein the second connecting member comprises a wire.

Clause 11.

The electronic device according to any one of Clauses 8 to 10, further including a control element that is arranged on the substrate obverse surface and controls driving of the electronic element, wherein the control signal includes a driving signal for controlling driving of the electronic element.

Clause 12.

The electronic device according to Clause 11, further including a third connecting member that is joined to the control element and the wiring portion.

Clause 13.

The electronic device according to Clause 12, wherein the third connecting member comprises a wire.

Clause 14.

The electronic device according to any one of Clauses 11 to 13, further including a conductive third lead that is spaced apart from the first lead and the second lead, wherein the third lead is joined to the wiring portion and electrically connected to the control element via the wiring portion.

Clause 15.

The electronic device according to Clause 14, further including a resin member that covers at least a portion of the substrate, the wiring portion, the conduction member, the electronic element, the control element, and the first connecting member, wherein each of the first lead, the second lead, and the third lead includes a portion that is exposed from the resin member.

Clause 16.

The electronic device according to Clause 15, wherein the substrate reverse surface is exposed from the resin member.

Clause 17.

The electronic device according to any one of Clauses 1 to 16, wherein the first pad portion overlaps with the substrate as viewed in the thickness direction.

Clause 18.

The electronic device according to any one of Clauses 1 to 17, wherein the conduction member contains Cu.

Clause 19.

The electronic device according to any one of Clauses 1 to 18, wherein the substrate contains a ceramic.

Clause 20.

The electronic device according to any one of Clauses 1 to 19, wherein the electronic element comprises a power transistor.

REFERENCE NUMERALS

A1, A2: Electronic device 1: Substrate

11: Substrate obverse surface 12: Substrate reverse surface

2: Wiring portion 21: Pad portion

22: Connection wire 29: Conduction member

291: Obverse surface (of conduction member)

292: Reverse surface (of conduction member)

3, 3a, 3b: Electronic element 31: Element obverse surface

311: First obverse surface electrode

312: Second obverse surface electrode

32: Element reverse surface 321: Reverse surface electrode

39: Protective element 391: Obverse surface electrode

392: Reverse surface electrode 4, 4a, 4b: Control element

40: Control device 401: Resin package

402: Connection terminal 5: Passive element

5a: Thermistor 5b: Shunt resistor

6: Lead 61: First lead

611: First pad portion 612: First terminal portion

62: Second lead 621: Second pad portion

622: Second terminal portion 63: Third lead

631: Third pad portion 632: Third terminal portion

64: Fourth lead 641: Fourth pad portion

642: Fourth terminal portion 65, 66: Input lead 651, 661: Pad portion 652, 662: Terminal portion 67: Output lead 671: Pad portion 672: Terminal portion 68: Detection lead 681: Pad portion 682: Terminal portion 71: First connecting member 711: Joined portion 712: Joined portion 713: Linear portion 72: Second connecting member 721: Joined portion 722: Joined portion 723: Intermediate joined portion 724: Linear portion 73: Third connecting member 74: Fourth connecting member 75: Fifth connecting member 8: Resin member 81: Resin obverse surface 82: Resin reverse surface 831 to 834: Resin side surface

The invention claimed is:

1. An electronic device comprising:

a substrate that includes a substrate obverse surface and a substrate reverse surface that are spaced apart from each other in a thickness direction;

an electronic element that includes an element obverse surface on which a first obverse surface electrode is formed;

a wiring portion that is formed on the substrate obverse surface and transmits a control signal for controlling the electronic element;

a conduction member that includes an obverse surface and a reverse surface that are spaced apart from each other in the thickness direction, the reverse surface being joined to the wiring portion;

a conductive first lead that is arranged on the substrate obverse surface; and a first connecting member that is joined to the obverse surface of the conduction member and the first obverse surface electrode, wherein the first lead includes a first pad portion that is spaced apart from the wiring portion and to which the electronic element is joined, the wiring portion and the first obverse surface electrode are electrically connected to each other via the conduction member and the first connecting member, the first pad portion is greater in size along the thickness direction than the wiring portion, a thickness of the conduction member is larger than a difference between a thickness of the wiring portion and a thickness of the first pad portion, the wiring portion is formed with a first wiring pad portion at one end of the wiring portion, a second wiring pad portion at an opposite end of the wiring portion, and a third wiring pad portion at an intermediate part of the wiring portion between the one end and the opposite end, and the conduction member is bonded to the third wiring pad portion.

2. The electronic device according to claim 1, wherein, as viewed in the thickness direction, the conduction member and the electronic element are arranged along an orthogonal direction that is orthogonal to the thickness direction, and the obverse surface of the conduction member overlaps with the electronic element as viewed in the orthogonal direction.

3. The electronic device according to claim 2, wherein the obverse surface of the conduction member overlaps with the element obverse surface as viewed in the orthogonal direction.

4. The electronic device according to claim 1, wherein the first connecting member comprises a wire.

5. The electronic device according to claim 4, wherein the first connecting member includes a preceding bonding portion that is bonded to the first obverse surface electrode and a succeeding bonding portion that is bonded to the obverse surface of the conduction member.

6. The electronic device according to claim 1, wherein the electronic element includes an element reverse surface opposite to the element obverse surface, and a reverse surface electrode that is joined and electrically connected to the first pad portion is formed on the element reverse surface.

7. The electronic device according to claim 6, further comprising a conductive second lead that is spaced apart from the first lead, wherein the element obverse surface is formed with a second obverse surface electrode that is spaced apart from the first obverse surface electrode and electrically connected to the second lead.

8. The electronic device according to claim 7, further comprising a second connecting member that is joined to the second lead and the second obverse surface electrode.

9. The electronic device according to claim 8, wherein the second connecting member comprises a wire.

10. The electronic device according to claim 7, further comprising a control element that is arranged on the substrate obverse surface and controls driving of the electronic element, wherein the control signal includes a driving signal for controlling driving of the electronic element.

11. The electronic device according to claim 10, further comprising a third connecting member that is joined to the control element and the wiring portion.

12. The electronic device according to claim 11, wherein the third connecting member comprises a wire.

13. The electronic device according to claim 10, further comprising a conductive third lead that is spaced apart from the first lead and the second lead, wherein the third lead is joined to the wiring portion and electrically connected to the control element via the wiring portion.

14. The electronic device according to claim 13, further comprising a resin member that covers at least a portion of the substrate, the wiring portion, the conduction member, the electronic element, the control element, and the first connecting member, wherein each of the first lead, the second lead, and the third lead includes a portion that is exposed from the resin member.

15. The electronic device according to claim 14, wherein the substrate reverse surface is exposed from the resin member.

16. The electronic device according to claim 1, wherein the first pad portion overlaps with the substrate as viewed in the thickness direction.

17. The electronic device according to claim 1, wherein the conduction member contains Cu.

18. The electronic device according to claim 1, wherein the substrate contains a ceramic.

19. The electronic device according to claim 1, wherein the electronic element comprises a power transistor.

\* \* \* \* \*